United States Patent
Mutch et al.

(10) Patent No.: US 11,587,938 B2
(45) Date of Patent: Feb. 21, 2023

(54) METHODS OF INCORPORATING LEAKER DEVICES INTO CAPACITOR CONFIGURATIONS TO REDUCE CELL DISTURB, AND CAPACITOR CONFIGURATIONS INCORPORATING LEAKER DEVICES

(71) Applicant: Micron Technology, Inc., Boise, ID (US)

(72) Inventors: Michael Mutch, Meridian, ID (US);
Sanket S. Kelkar, Boise, ID (US);
Ashonita A. Chavan, Boise, ID (US);
Sameer Chhajed, Boise, ID (US);
Adriel Jebin Jacob Jebaraj, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/897,556

(22) Filed: Jun. 10, 2020

(65) Prior Publication Data
US 2021/0391343 A1 Dec. 16, 2021

(51) Int. Cl.
*H01L 27/11507* (2017.01)
*H01L 27/1159* (2017.01)
(Continued)

(52) U.S. Cl.
CPC .... *H01L 27/11507* (2013.01); *H01L 27/1159* (2013.01); *H01L 27/11504* (2013.01); *H01L 27/11587* (2013.01); *H01L 28/56* (2013.01)

(58) Field of Classification Search
None
See application file for complete search history.

(56) References Cited

U.S. PATENT DOCUMENTS

| | | | |
|---|---|---|---|
| 2005/0128663 A1* | 6/2005 | Yamazaki | H01L 28/55 361/56 |
| 2007/0200162 A1* | 8/2007 | Tu | H01L 28/40 257/314 |

(Continued)

FOREIGN PATENT DOCUMENTS

| KR | 10-0861367 B1 | 10/2008 |
|---|---|---|
| WO | WO PCT-US2021-032336 | 8/2021 |

OTHER PUBLICATIONS

Liang Tian, "Undoped TiO2 and nitrogen-doped TiO2 thin films deposited by atomic layer deposition on planar and architectured surfaces for photovoltaic applications", Jan. 2015, ResearchGate, Journal of Vacuum Science & Technology AA 33, 01A141 (2015); doi: 10.1116/1.490, pp. 1-6 (Year: 2015).*

*Primary Examiner* — Steven M Christopher
(74) *Attorney, Agent, or Firm* — Wells St. John P.S.

(57) ABSTRACT

Some embodiments include a capacitor having a container-shaped bottom portion. The bottom portion has a first region over a second region. The first region is thinner than the second region. The first region is a leaker region and the second region is a bottom electrode region. The bottom portion has an interior surface that extends along the first and second regions. An insulative material extends into the container shape. The insulative material lines the interior surface of the container shape. A conductive plug extends into the container shape and is adjacent the insulative material. A conductive structure extends across the conductive plug, the insulative material and the first region of the bottom portion. The conductive structure directly contacts the insulative material and the first region of the bottom portion, and is electrically coupled with the conductive plug. Some embodiments include methods of forming assemblies.

53 Claims, 16 Drawing Sheets

(51) Int. Cl.
  *H01L 49/02*      (2006.01)
  *H01L 27/11587*   (2017.01)
  *H01L 27/11504*   (2017.01)

(56) References Cited

U.S. PATENT DOCUMENTS

| | | |
|---|---|---|
| 2011/0266603 A1 | 11/2011 | Nakamura |
| 2017/0053923 A1 | 2/2017 | Hwang |
| 2019/0067298 A1* | 2/2019 | Karda .................... G11C 11/401 |
| 2019/0189357 A1* | 6/2019 | Chavan .................... H01L 28/56 |

* cited by examiner

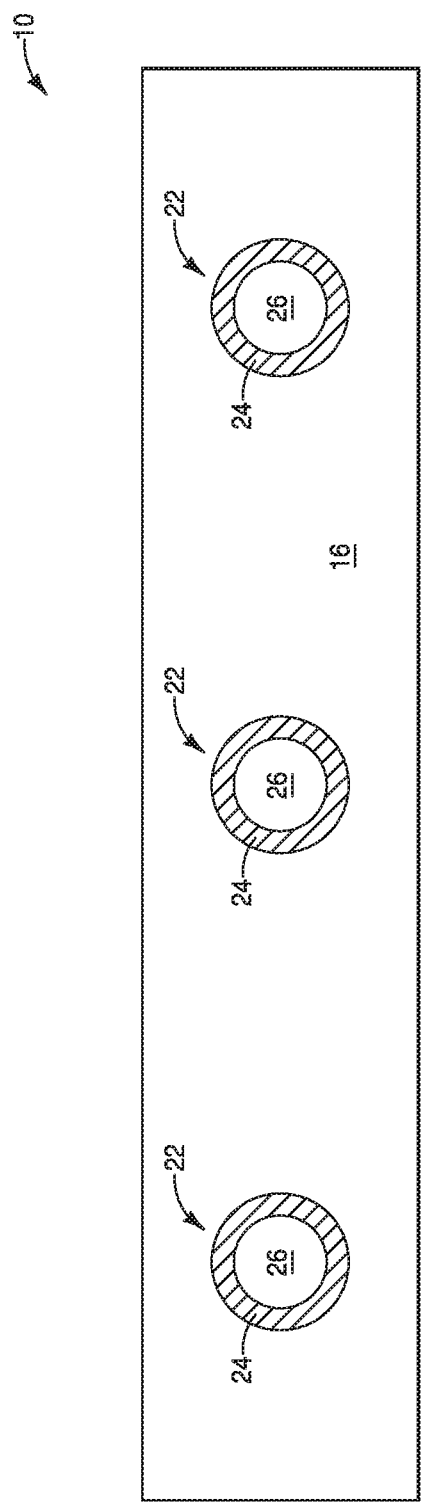

METHODS OF INCORPORATING LEAKER DEVICES INTO CAPACITOR CONFIGURATIONS TO REDUCE CELL DISTURB, AND CAPACITOR CONFIGURATIONS INCORPORATING LEAKER DEVICES

TECHNICAL FIELD

Integrated assemblies (e.g., integrated memory). Methods of incorporating leaker devices into capacitor configurations to reduce cell disturb. Capacitor configurations incorporating leaker devices. Memory arrays comprising leaker devices.

BACKGROUND

Computers and other electronic systems (for example, digital televisions, digital cameras, cellular phones, etc.), often have one or more memory devices to store information. Increasingly, memory devices are being reduced in size to achieve a higher density of storage capacity. Even when increased density is achieved, consumers often demand that memory devices also use less power while maintaining high speed access and reliability of data stored on the memory devices.

Leakage within memory cells can be problematic for at least the reasons that such may make it difficult to reliability store data, and may otherwise waste power. Leakage may be become increasingly difficult to control as circuitry is scaled to increasingly smaller dimensions.

It would be desirable to develop architectures which alleviate, or even prevent, undesired leakage; and to develop methods for fabricating such architectures.

BRIEF DESCRIPTION OF THE DRAWINGS

FIG. 3A is a top-down cross-sectional view along the line A-A of FIG. 3.

DETAILED DESCRIPTION OF THE ILLUSTRATED EMBODIMENTS

Some embodiments include utilization of leaker devices to reduce charge buildup along bottom electrodes of capacitors. The leaker devices may couple the bottom electrodes to conductive plates. The conductive plates may be along top electrodes of the capacitors, and may be utilized to electrically couple the top electrodes to one another. The leaker devices may have conductivity (or alternatively, resistance) tailored to enable excess charge to drain from the bottom electrodes to the conductive plate, while not enabling problematic shorting between the bottom electrodes and the conductive plate.

Many, if not most, primary memory cell disturb mechanisms are due to a buildup of potential at cell bottom (CB) electrode nodes. As discussed in more detail below, this disturb mechanism is applicable for ferroelectric RAM (FERAM). However, other types of electronic devices may benefit from the disclosed subject matter as well.

In an embodiment, each of the memory cells in a memory array can be programmed to one of two data states to represent a binary value of "0" or "1" in a single bit. Such a cell is sometimes called a single-level cell (SLC). Various operations on these types of cells are independently known in the semiconductor and related arts.

Regardless of the memory cell arrangement, the primary disturb mechanisms discussed above can arise due to different factors. For example, charge on the cell bottom-node can rise due to factors such as plate glitch, access transistor leakage, cell-to-cell interactions, and/or other factors. If a dielectric material in a memory cell leaks significantly, the state of the cell may be adversely affected.

In various embodiments described herein, leaker devices are introduced into a memory array to prevent build-up of potential at bottom nodes of capacitors associated with individual memory cells. Example embodiments are described with reference to FIGS. 1-16.

Figure 1:
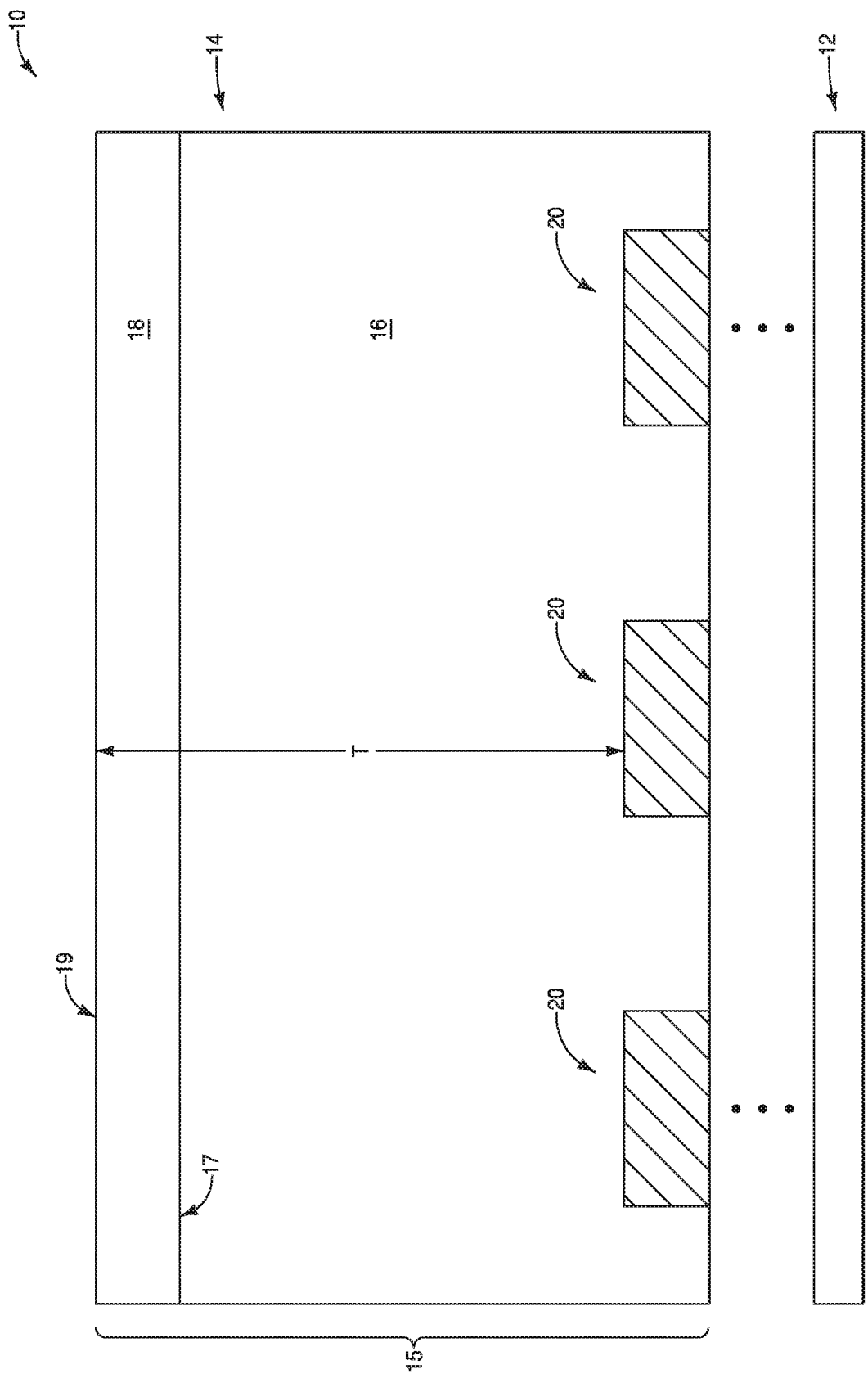
FIGS. 1-10 are diagrammatic cross-sectional side views of a region of an example assembly at example sequential process stages of an example method.

Referring to FIG. 1, an assembly (apparatus) 10 comprises a construction 14 over a base 12.

The base 12 may comprise semiconductor material; and may, for example, comprise, consist essentially of, or consist of monocrystalline silicon. The base 12 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 12 may correspond to a semiconductor substrate containing one or more materials associated with integrated circuit fabrication. Such materials may include, for example, one or more of refractory metal materials, barrier materials, diffusion materials, insulator materials, etc.

A gap is shown between the base 12 and the construction 14 to indicate that there may be additional materials, components, etc., provided between the base 12 and the construction 14.

The construction 14 is shown to comprise an insulative mass 15. The insulative mass comprises a second insulative material 18 over a first insulative material 16, with the first and second insulative materials being directly adjacent one another along an interface 17. The interface 17 may be considered to correspond to a bottom surface of the second insulative material 18 and/or to a top surface of the first insulative material 16. In some embodiments the second insulative material 18 may comprise, consist essentially of, or consist of silicon nitride; and the first insulative material 16 may comprise, consist essentially of, or consist of silicon dioxide.

The construction 14 has an upper surface 19 extending across an upper surface of the second insulative material 18.

Conductive blocks (structures) 20 are shown within a bottom region of the first insulative material 16. The conductive blocks may be considered to be formed over the base 12 and to be supported by the base 12.

The conductive blocks 20 are conductive interconnects. Processing described herein forms capacitors (e.g., capacitors shown in FIG. 10), and the conductive blocks 20 may be utilized to couple electrodes of such capacitors with additional circuitry (e.g., transistors shown in FIG. 10).

The conductive blocks 20 may comprise any suitable composition or combination of compositions; such as, for example, one or more of various metals (e.g., titanium, tungsten, cobalt, ruthenium, nickel, platinum, etc.), metal-containing compositions (e.g., metal silicide, metal nitride, metal carbide, etc.), and/or conductively-doped semiconductor materials (e.g., conductively-doped silicon, conductively-doped germanium, etc.).

Although the insulative materials 16 and 18 are shown to be homogeneous in the illustrated embodiment, in other embodiments one or both of the materials 16 and 18 may be a heterogeneous combination of two or more compositions. Similarly, the illustrated conductive blocks 20 may be heterogeneous combinations of two or more compositions.

In some embodiments, at least some of the mass 15 may be considered to be formed over the blocks 20. The mass 15 may be formed to any suitable thickness T over the blocks 20, and in some embodiments the thickness T may be within a range of from about 100 nanometers (nm) to about 500 nm.

Figure 2:
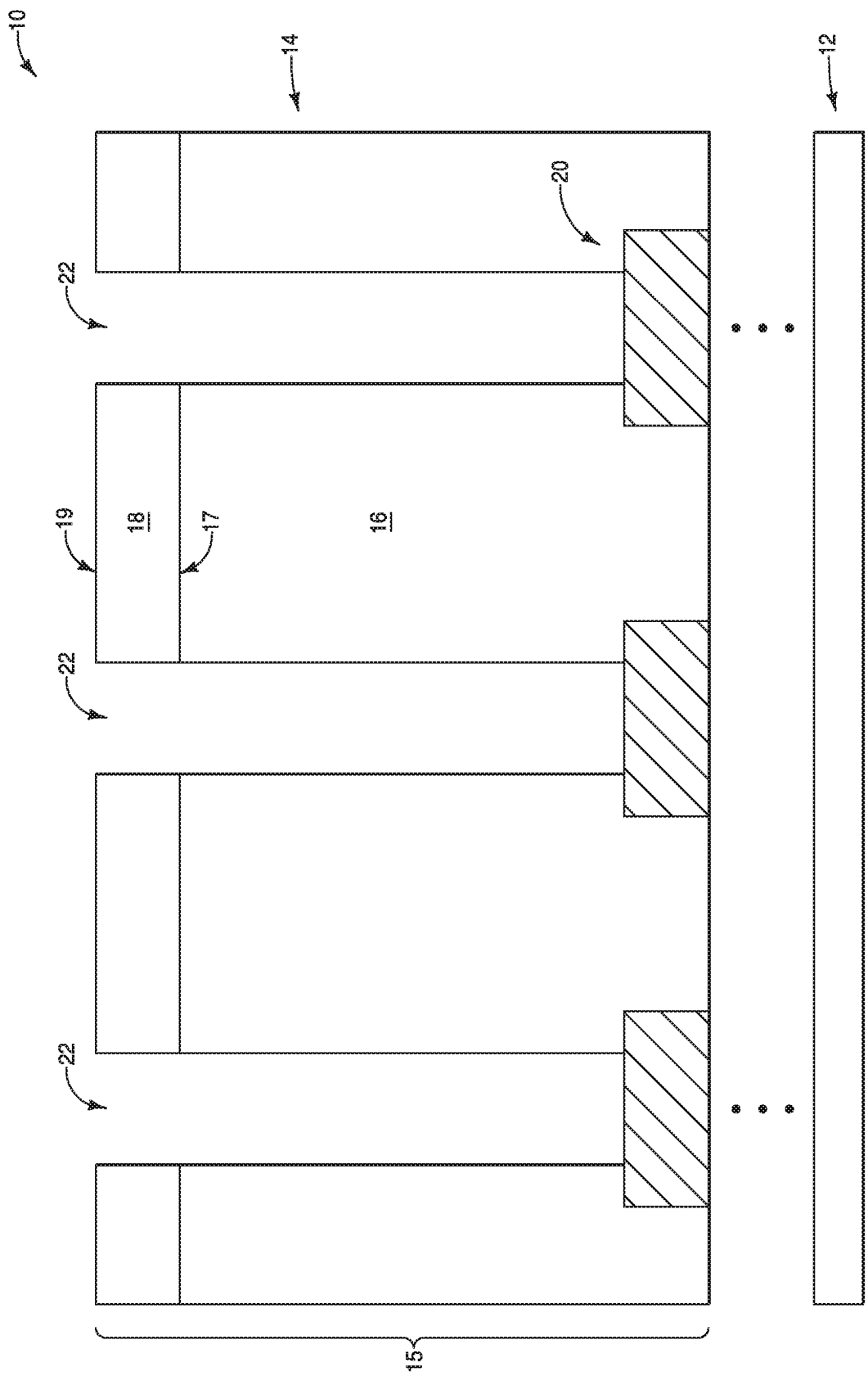

Referring to FIG. 2, openings 22 are formed to extend through the insulative mass 15 to the conductive blocks 20. The openings 22 may be formed with any suitable processing. For instance, a patterned mask (not shown) may be provided over the construction 14 and utilized to define locations of openings 22, and then the openings 22 may be extended into the mass 15 with one or more suitable etches. Subsequently, the patterned mask may be removed to leave the assembly of FIG. 2.

Figure 3:
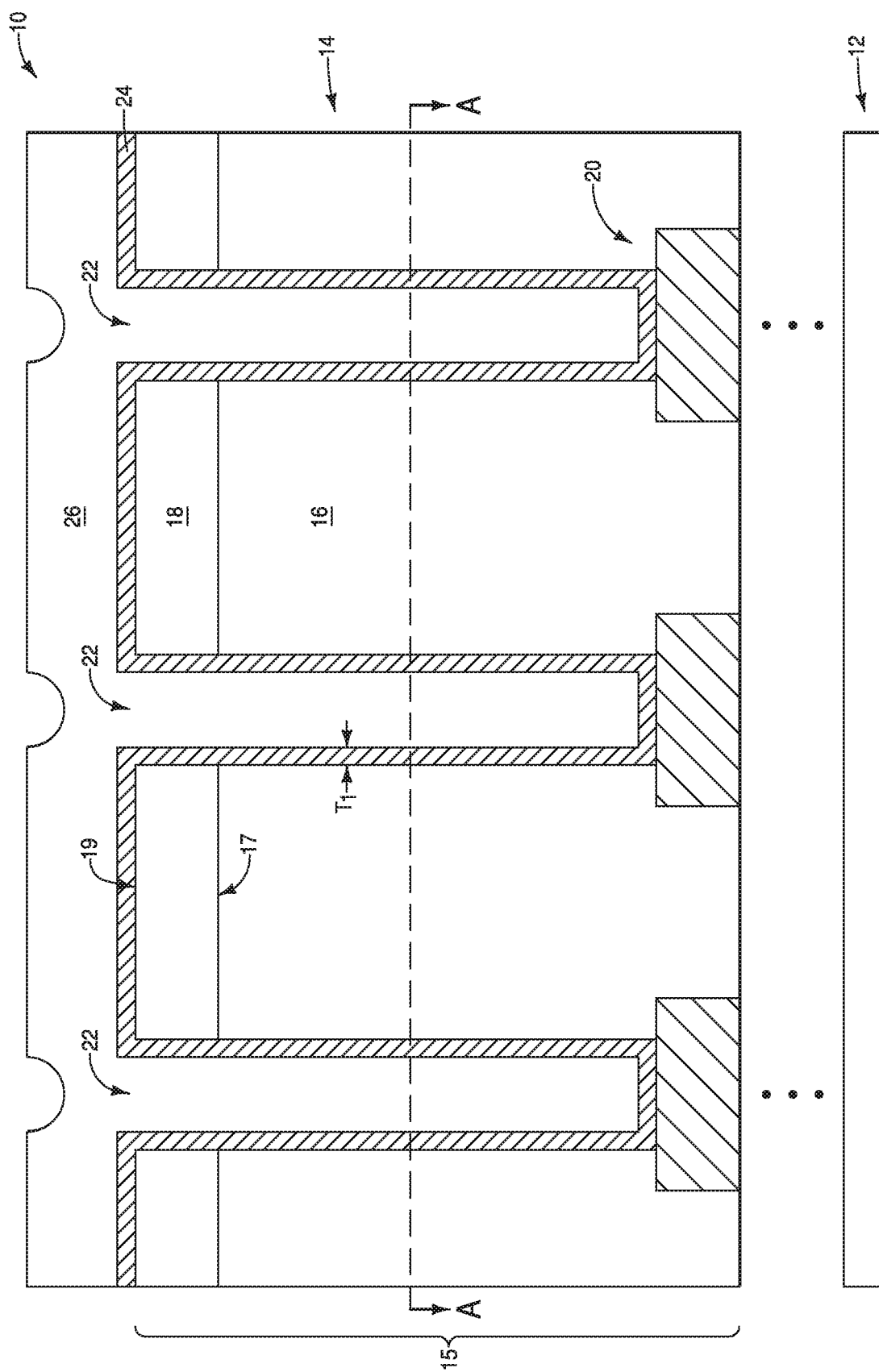

Referring to FIG. 3, the openings 22 are lined with a first conductive material 24 (which may be referred to as bottom electrode material). The conductive material 24 may comprise any suitable composition(s). In some embodiments the conductive material 24 may comprise, consist essentially of, or consist of one or more of aluminum, hafnium, zirconium, titanium, nickel and niobium in combination with one or more of boron, germanium, silicon, oxygen, nitrogen and carbon. In some embodiments, the conductive material 24 may comprise, consist essentially of, or consist of one or more of Si, Ge, SiN, TiSiN, TiO, TiN, NiO, NiON and TiON; where the chemical formulas indicate primary constituents rather than particular stoichiometries.

In some embodiments the conductive material 24 may comprise, consist essentially of, or consist of TiON; where the chemical formula indicates primary constituents rather than a specific stoichiometry. In an example embodiment, the Ti may be present within a range of from about 20 atomic percent (at %) to about 50 at %, the O may be present within a range of from about 10 at % to about 80 at %, and the N may be present within a range of from about 10 at % to about 80 at %. In another example embodiment, the Ti may be present to about 40 at %, the O may be present within a range of from about 10 at % to about 50 at %, and the N may be present within a range of from about 10 at % to about 50 at %.

The TiON may be in any suitable form, and in some embodiments may be substantially entirely in an orthorhombic crystalline form (where the term "substantially entirely" means "entirely" to within reasonable tolerances of fabrication and measurement).

The conductive material 24 is deposited to a thickness $T_1$. In some embodiments the thickness $T_1$ may be within a range of from about 3 nm to about 50 nm.

The conductive material 24 lines the openings 22.

A fill material (sacrificial material) 26 is provided over the conductive material 24 and within the openings 22. The fill material may comprise any suitable composition(s); and in some embodiments may include one or more of spin-on-dielectric (SOD), spin-on-carbon (SOC), photoresist, etc. If the fill material 26 comprises SOD or SOC, such may be densified with appropriate processing.

The filled openings 22 may have any suitable shape when viewed from above. For instance, FIG. 3A shows a top-down view along the line A-A of FIG. 3 in an example application in which the openings 22 are circular-shaped. In other embodiments, the openings 22 may have other shapes, including, for example, elliptical shapes, polygonal shapes, etc.

Figure 4:
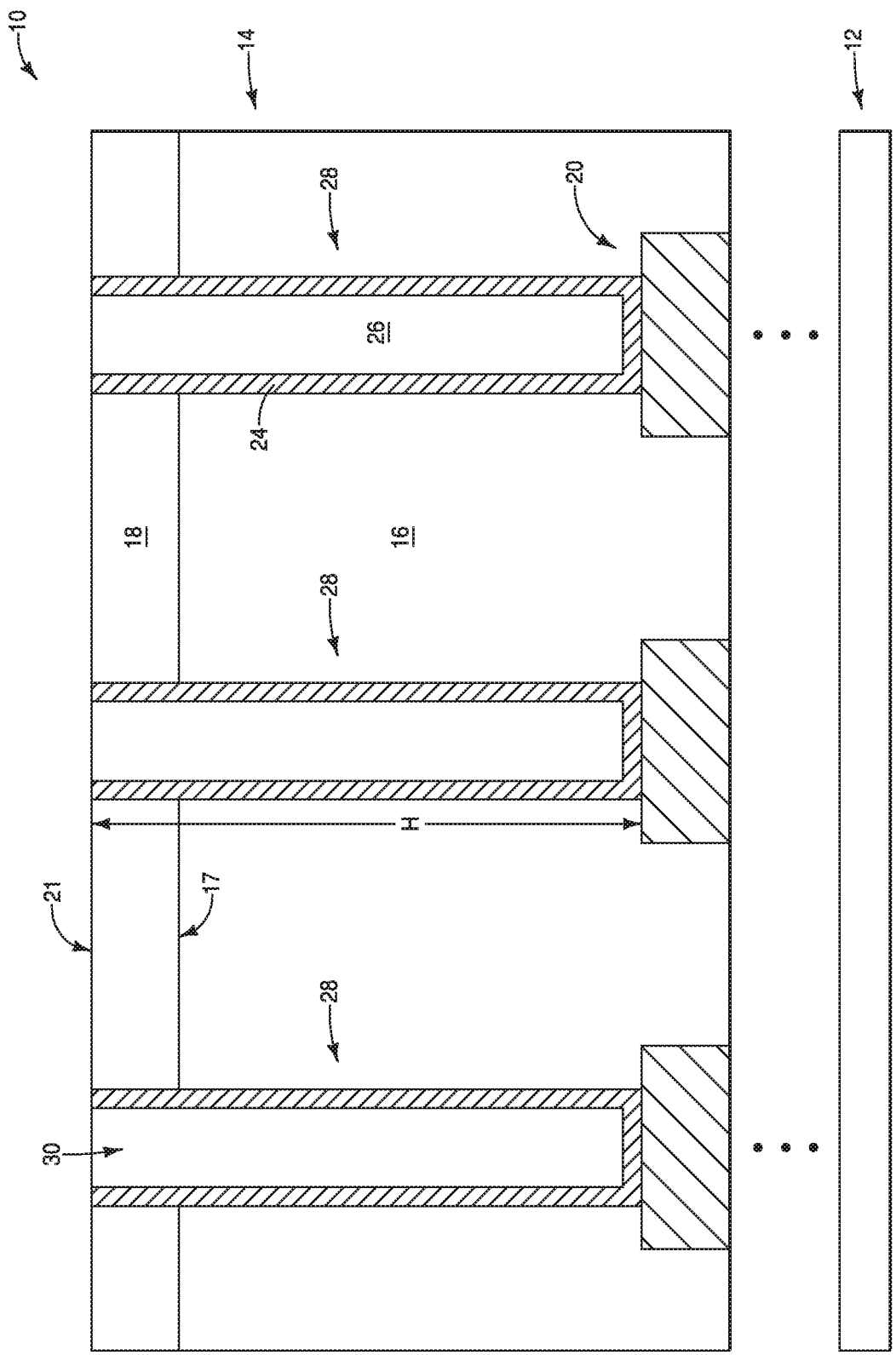

Referring to FIG. 4, the assembly 10 is subjected to planarization (e.g., chemical-mechanical polishing, CMP) to remove excess materials 24 and 26 from over the material 18, and to form a planarized surface 21 extending across the materials 18, 24 and 26.

The conductive material 24 is configured as upwardly-opening container-shaped structures (containers) 28 at the processing stage of FIG. 4. The sacrificial material 26 is within the upwardly-opening containers of the container-shaped structures 28. The container-shaped structures 28 each has a height H over an associated block 20. In some embodiments, such heights may be within a range of from about 100 nm to about 500 nm.

Figure 5:
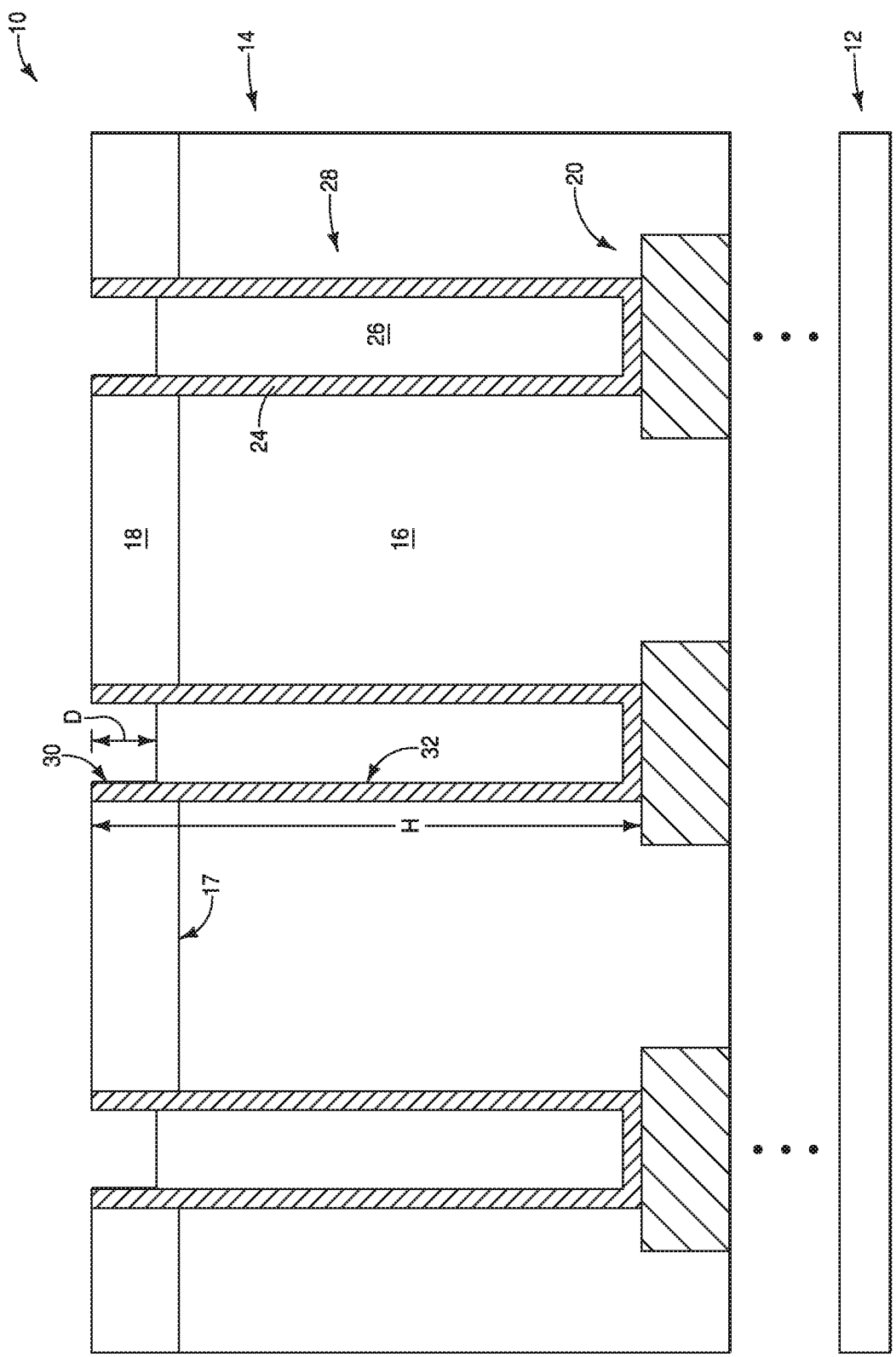

Referring to FIG. 5, the sacrificial material 26 is recessed to a depth D within the containers 28. The depth D may be any suitable depth, and in some embodiments may be within a range of from about 1 nm to about 40 nm, within a range of from about 1 nm to about 60 nm, within a range of from about 1 nm to about 80 nm, etc. Alternatively, in some embodiments the depth D may be within a range of from about 1 nm to about 95% of the height H, within a range of from about 1 nm to about 50% of the height H; within a range of from about 1 nm to about 20% of the height H, within a range of from about 1 nm to about 10% of the height H, etc. In some embodiments, the height H may be referred to as a first height, and the depth D a referred to as a second height.

In the illustrated embodiment the depth D extends to a level which is above an elevational level of the interface 17.

The recessing of the sacrificial material 26 exposes upper regions 30 of the container-shaped structures 28, while leaving lower regions 32 of the container-shaped structures 28 protected by the sacrificial material 26.

Figure 6:
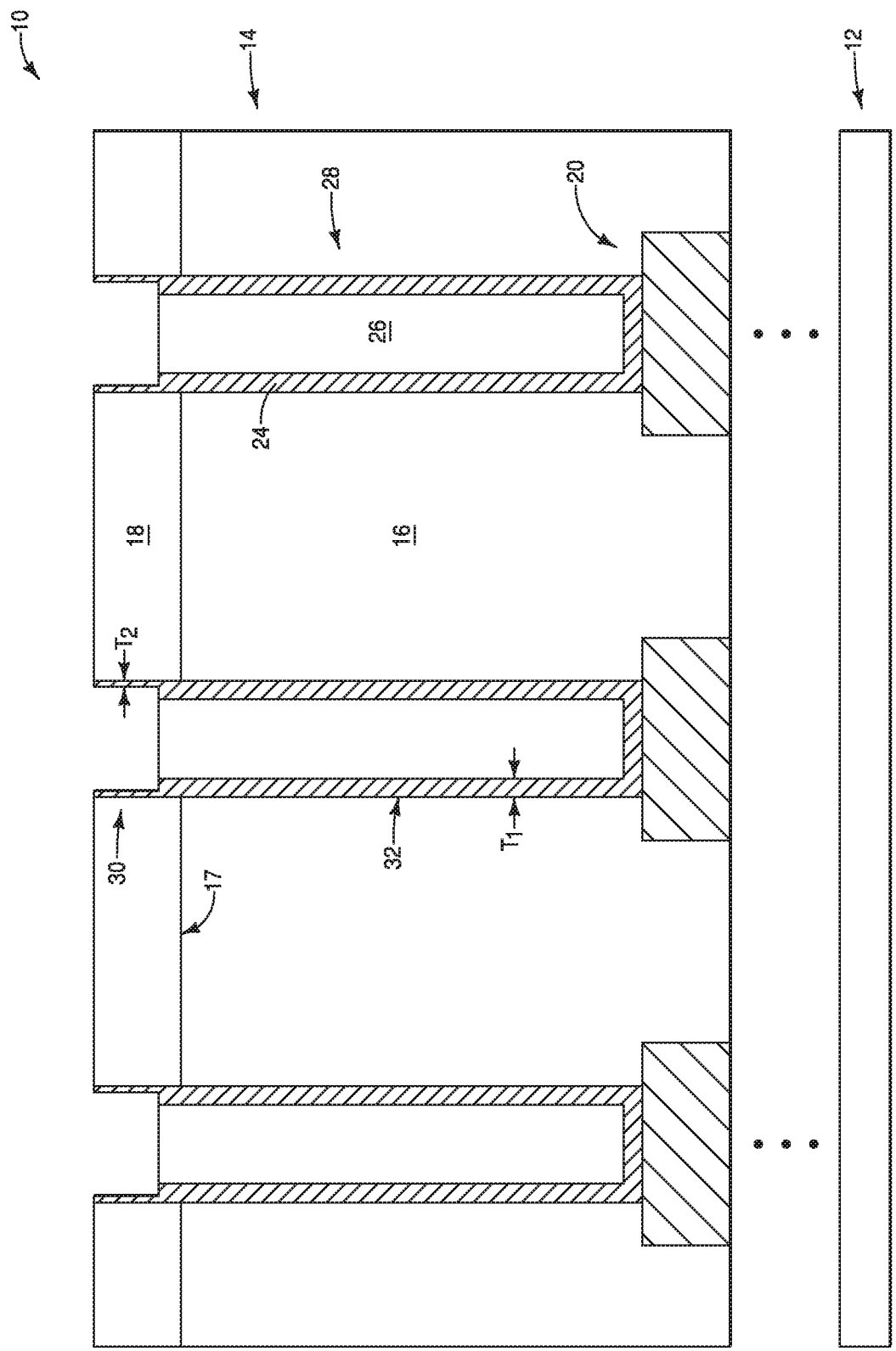

Referring to FIG. 6, the exposed upper regions 30 of the container-shaped structures 28 are thinned (narrowed), while the protected lower regions 32 of the container-shaped structures 28 remain thick (i.e., remain at the original thickness $T_1$). The thinned upper regions 30 have a thickness $T_2$, which may be referred to as a second thickness to distinguish it from the first thickness $T_1$. The second thickness $T_2$ may be within a range of from about 1% to about 99% of the first thickness $T_1$, may be within a range of from about 8% to about 90% of the first thickness $T_1$, and in some embodiments may be within a range of from about 10 angstroms (Å) to about 100 Å.

The thinning of the conductive material 24 may be accomplished with any suitable processing, including, for example, atomic layer etching, plasma etching, and any other suitable physical and/or chemical processes. In some embodiments, such thinning may be accomplished utilizing conditions of standard clean 1 (SC1); with example conditions utilizing hydrogen peroxide, ammonia and water.

Figure 7:
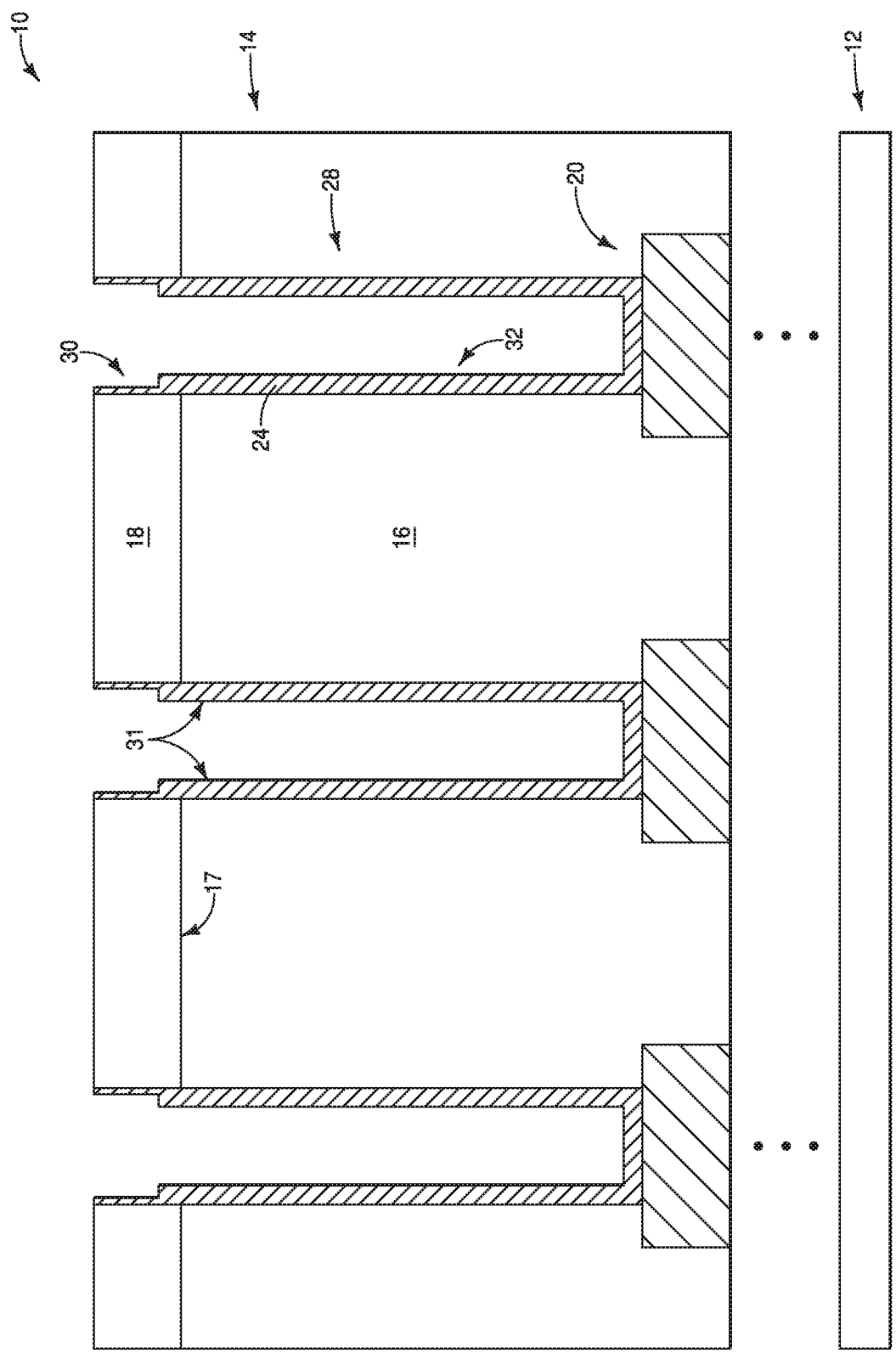

Referring to FIG. 7, the sacrificial material 26 (FIG. 6) is removed. The structures 28 have exposed interior surfaces 31 at the process stage of FIG. 7, with such interior surfaces extending along the thinned regions 30 and the thick regions 32.

Figure 8:
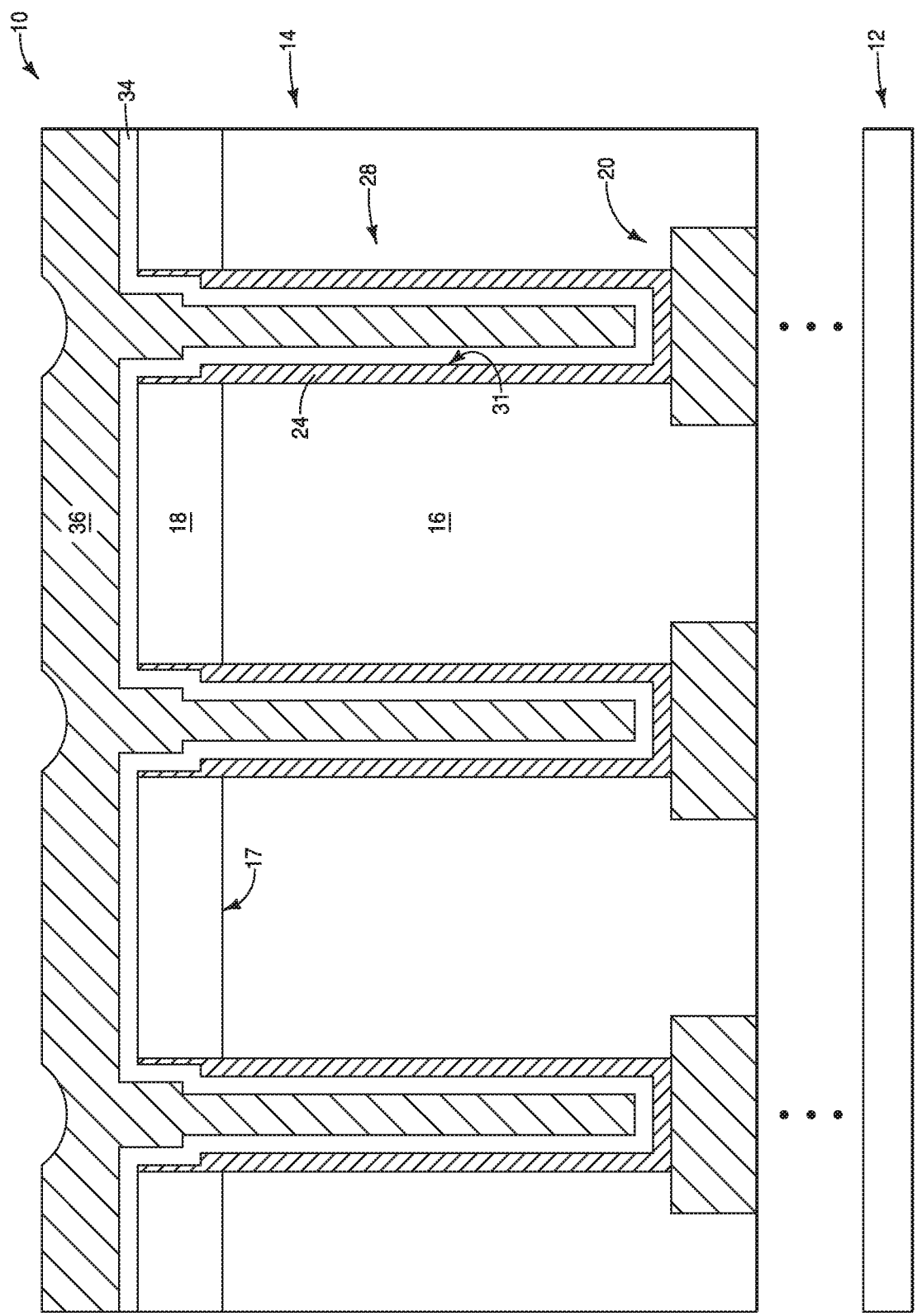

Referring to FIG. 8, insulative-capacitor-material (insulative material) 34 is formed along and directly against the interior surfaces 31 of the container-shaped structures 28. The insulative-capacitor-material 34 may be considered to line interior regions of the container-shaped structures 28.

The insulative material 34 may comprise any suitable composition(s). In some embodiments, the insulative material 34 may be non-ferroelectric material (e.g., silicon dioxide). In some embodiments, the insulative material 34 may be ferroelectric insulative material. The ferroelectric insulative material may comprise any suitable composition or combination of compositions; and in some example embodiments may include one or more of transition metal oxide, zirconium, zirconium oxide, niobium, niobium oxide, hafnium, hafnium oxide, lead zirconium titanate, and barium strontium titanate. Also, in some example embodiments the ferroelectric insulative material may have dopant therein which comprises one or more of silicon, aluminum, lanthanum, yttrium, erbium, calcium, magnesium, strontium, and a rare-earth element.

The insulative material 34 may be formed to any suitable thickness; and in some embodiments may have a thickness within a range of from about 30 Å to about 250 Å.

Conductive material 36 is formed over the insulative material 34, and extends into the interior regions of the container-shaped structures 28.

The conductive material 36 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive material 36 may comprise, consist essentially of, or consist of one or more of molybdenum silicide, titanium nitride, titanium silicon nitride, ruthenium silicide, ruthenium, molybdenum, tantalum nitride, tantalum silicon nitride and tungsten.

Figure 9:
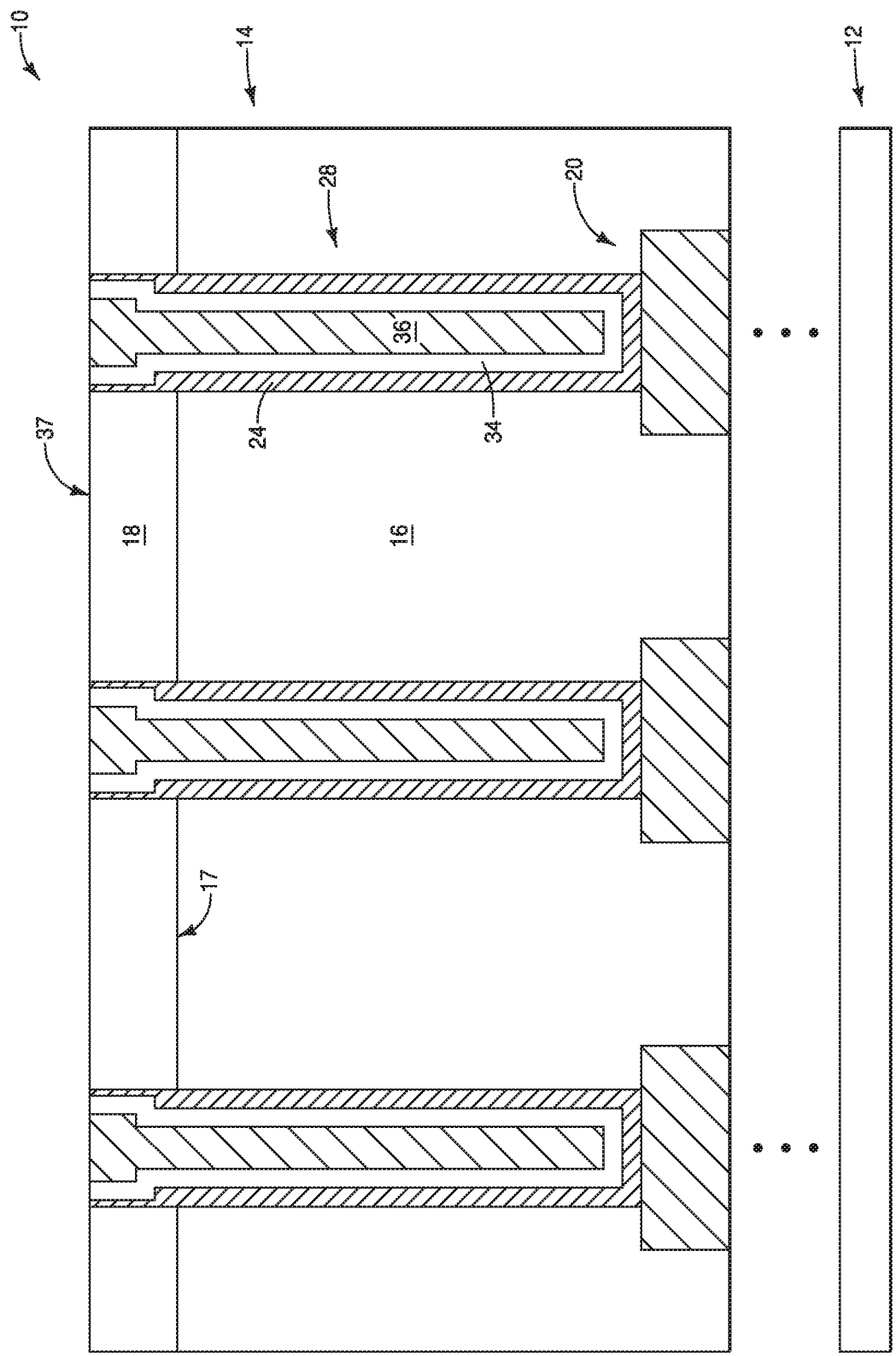

Referring to FIG. 9, the assembly 10 is subjected to planarization (e.g., CMP) to form a planarized surface 37 extending across the materials 18, 24, 34 and 36.

Figure 10:
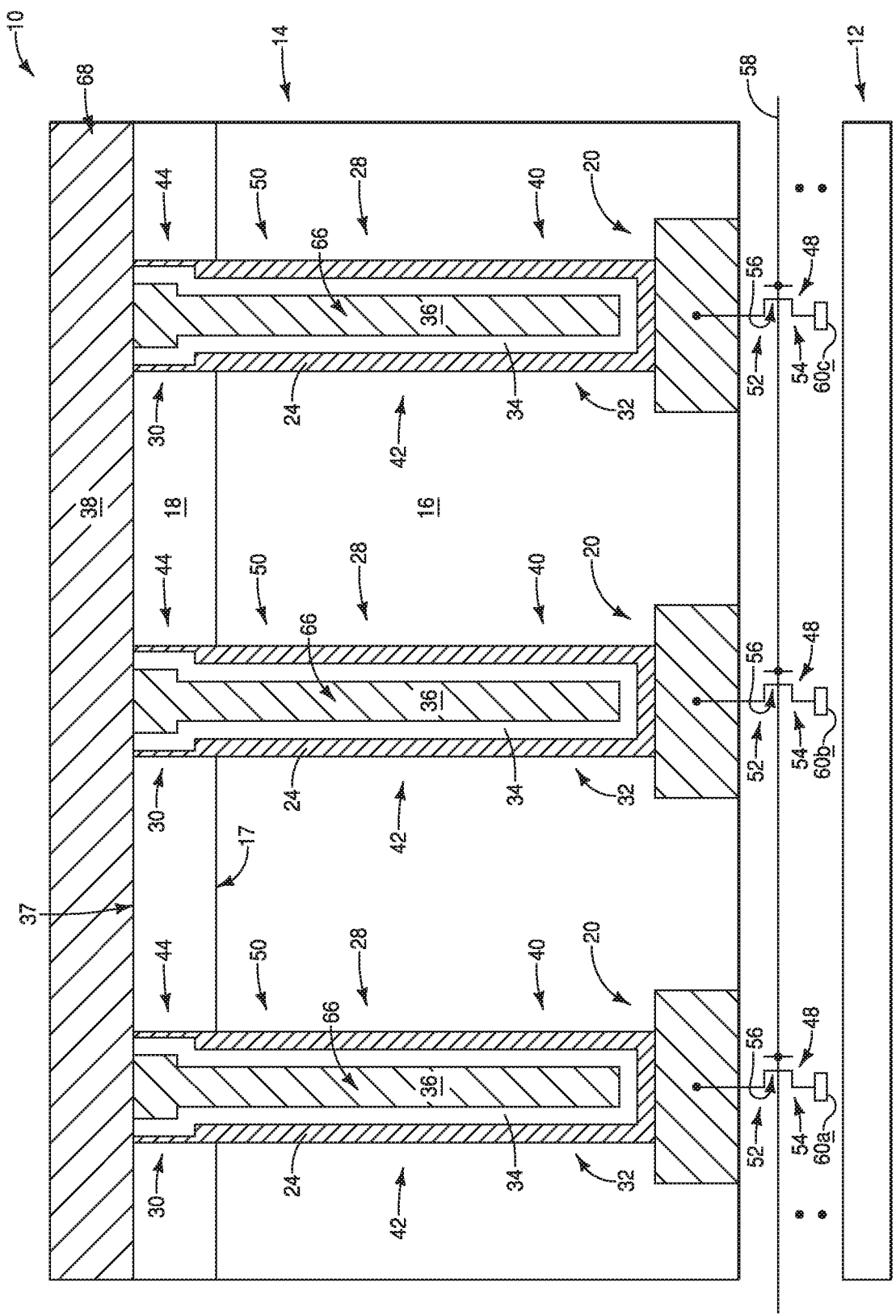

Referring to FIG. 10, conductive material 38 is formed along the planarized surface 37. The conductive material 38 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive material 38 may comprise, consist essentially of, or consist of one or more of molybdenum silicide, titanium nitride, titanium silicon nitride, ruthenium silicide, ruthenium, molybdenum, tantalum nitride, tantalum silicon nitride and tungsten. The conductive materials 36 and 38 may comprise a same composition as one another, or may comprise different compositions relative to one another.

In some embodiments, the conductive materials 36 and 38 may be referred to as first and second conductive materials, respectively. In some embodiments, the conductive material 36 within the container-shaped structures 28 may be referred to as capacitor-electrode-material, and the conductive material 38 may be referred to as conductive-plate-material.

The capacitor-electrode-material 36, insulative-capacitor-material 34 and container-shaped structures 28 together form a plurality of capacitors 40. The capacitors 40 may be representative of a large number of capacitors formed across a memory array.

The conductive-plate-material 38 extends across the capacitors 40, and is directly against the conductive material 24, the insulative material 34, and the conductive material 36.

The conductive material 36 may be considered to form electrodes (second electrodes, top electrodes) 66 of the capacitors 40, while the thick regions (thick electrode regions) 30 form other electrodes (first electrodes, bottom electrodes) 42 of the capacitors 40. The conductive material 38 may be considered to be configured as a conductive plate (conductive structure, conductive-plate-structure) 68 which extends across the capacitors 40, and which is electrically coupled with the electrodes 66.

In some embodiments, the container-shaped structures 28 of material 24 may be considered to be configured as bottom portions of the capacitors 40, with such bottom portions each having a thin region (first region) 30 over a thick region (second region) 32. The thin region is a leaker region (leaker device) 44, and the thick region is a bottom electrode region (or simply a bottom electrode) 42. In the illustrated embodiment, the electrodes 66 are configured as conductive plugs extending into the container shapes of the bottom portions of the capacitors 40. Such conductive plugs may or may not be a same composition as the conductive plate 68.

The thin region 30 is a same composition as the thick region 32, and accordingly there is no compositional interface between the regions 30 and 32.

Each of the leaker devices 44 is electrically coupled with a bottom electrode 42 of a capacitor 40, and with the plate-electrode-material 38; and in the shown embodiment is an extension of the material of the bottom electrode 42, and is directly against the plate-electrode-material 38. The illustrated leaker devices 44 do not extend to beneath the bottom surface 17 of the second material 18. In other embodiments, the leaker devices may extend to beneath such bottom surface of the material 18.

In some embodiments, the capacitors 40 may be incorporated into memory cells 50 (such as, for example, ferroelectric memory cells) by coupling the capacitors with appropriate circuit components. For instance, transistors 48 are diagrammatically illustrated in FIG. 10 as being coupled to the bottom electrodes 42 through the conductive interconnects (blocks) 20. The transistors 48, and/or other suitable components, may be fabricated at any suitable process stage. For instance, in some embodiments the transistors 48 may be fabricated at a processing stage prior to the illustrated process stage of FIG. 1.

The memory cells 50 may be part of a memory array; such as, for example, an FeRAM (Ferroelectric Random Access Memory) array.

In some embodiments, the leaker devices 44 may be considered to be resistive interconnects coupling bottom electrodes 42 within memory cells 50 to the conductive-plate-material (plate-electrode-material) 38. If the leaker devices are too leaky, then one or more memory cells may experience cell-to-cell disturb. If the leaker devices 44 are not leaky (conductive) enough, then excess charge from the bottom electrodes 42 will not be drained. Persons of ordinary skill in the art will recognize how to calculate the resistance needed for the leaker devices 44 for a given memory array. In some embodiments, the leaker devices 44 may have resistance within a range of from about 0.1 megaohms to about 5 megaohms. Factors such as separation between adjacent memory cells, the dielectric material used between the memory cells, physical dimensions of the memory cells, the amount of charge placed in the memory cells, a size of the memory array, a frequency of operations conducted by the memory array, etc., may be considered when making a determination of the resistance appropriate for the leaker devices 44.

The transistors 48 are shown to each comprise a first source/drain region 52, a second source/drain region 54, and a channel region 56 between the first and second source/drain regions. A wordline 58 extends across the transistors 48, with such wordline being gatedly coupled with the channel regions 56 to control electrical coupling between the first and second source/drain regions 52 and 54. The second source/drain regions 54 are coupled with digit lines 60a, 60b and 60c. In some embodiments, the wordline 58 may be considered to be an example of a first linear structure extending across a memory array comprising the memory cells 50, and the digit lines 60a-c may be considered to be examples of second linear structures extending across the memory array. Each of the memory cells 50 is addressed utilizing one of the first linear structures 58 (wordlines), and one of the second linear structures 60 (digit lines).

In the embodiment of FIGS. 1-10, the capacitor-electrode-material 36 is formed with a first deposition (at the processing stage of FIG. 8), and the conductive-plate-material 38 is formed with a second deposition (the process stage of FIG. 10) occurring subsequent to the first deposition. In other embodiments the capacitor-electrode-material and the conductive-plate-material may be formed together with a single deposition, as described with reference to FIGS. 11-14.

Figure 11:
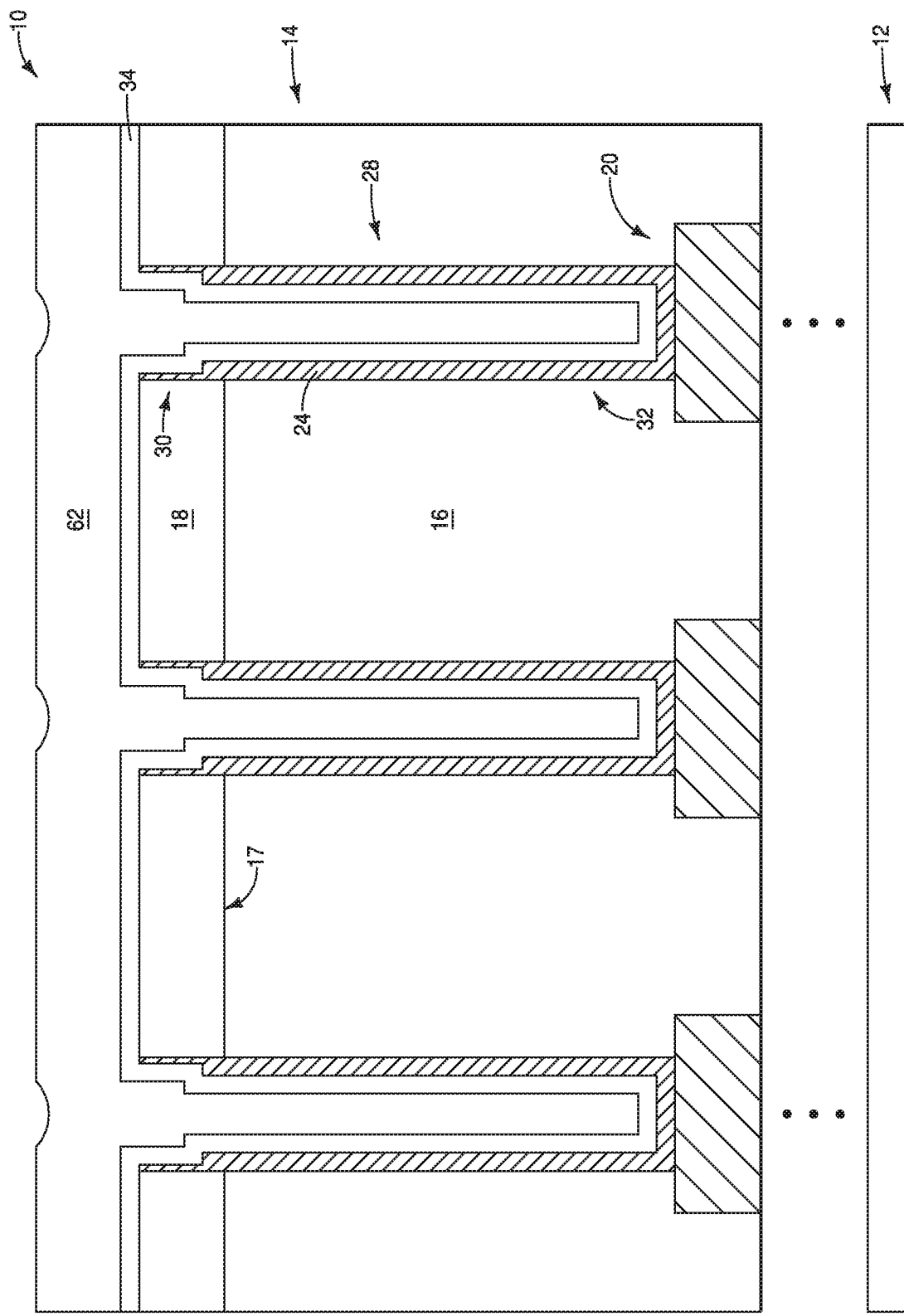
FIGS. 11-14 are diagrammatic cross-sectional side views of a region of an example assembly at example sequential process stages of an example method. The process stage of FIG. 11 may follow that of FIG. 7.

Referring to FIG. 11, the assembly 10 is shown at a process stage subsequent to that of FIG. 6. The sacrificial material 26 (FIG. 6) is removed. Subsequently, the insulative material 34 is formed within the interior regions of the container-shaped structures 28 to line such interior regions, and then additional sacrificial material 62 is formed within the lined interior regions of the structures (containers) 28.

Figure 12:
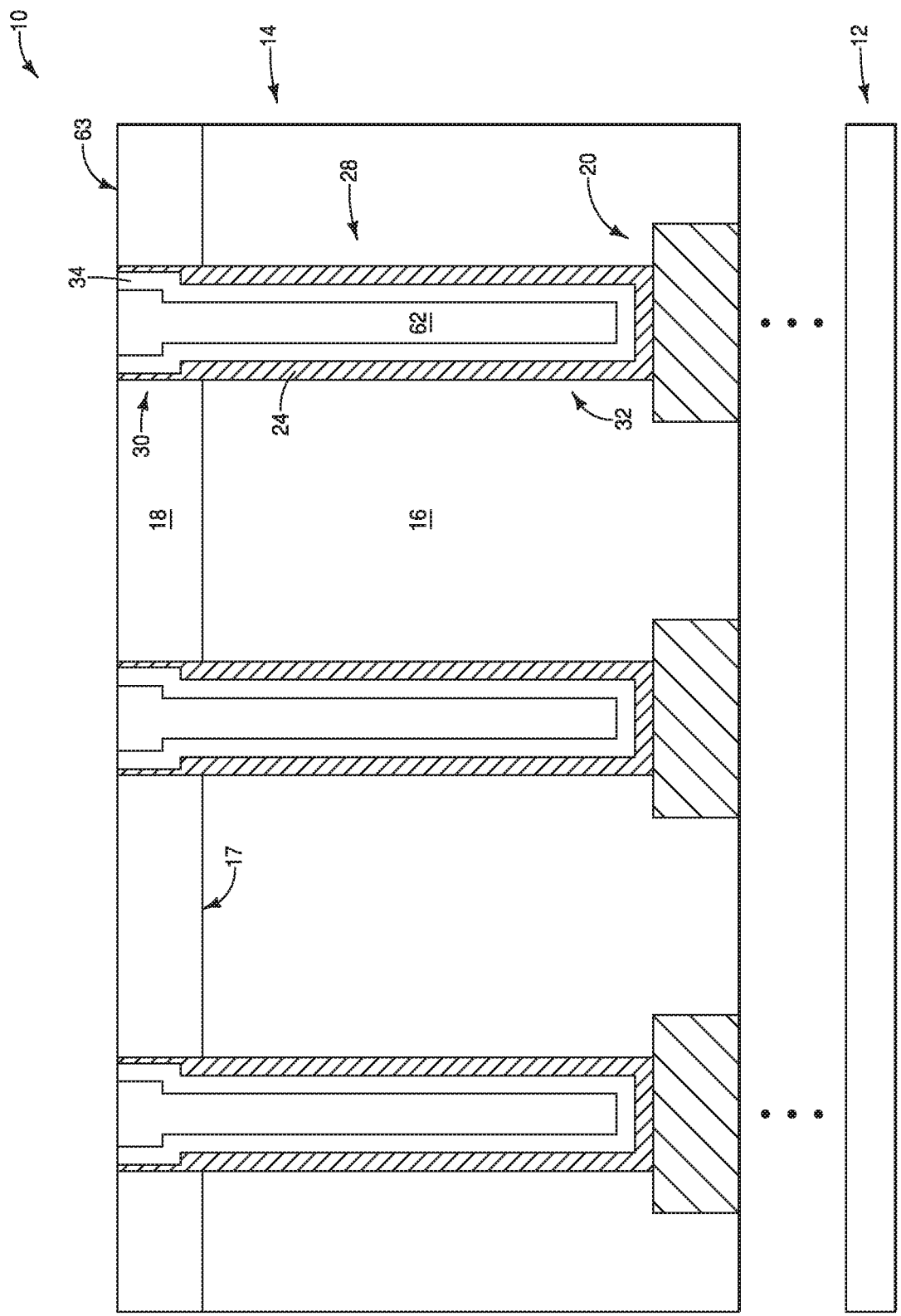

Referring to FIG. 12, a planarized surface 63 is formed to extend across the materials 18, 24, 34 and 62. The planarized surface 63 may be formed with any suitable processing, including, for example, CMP.

Figure 13:
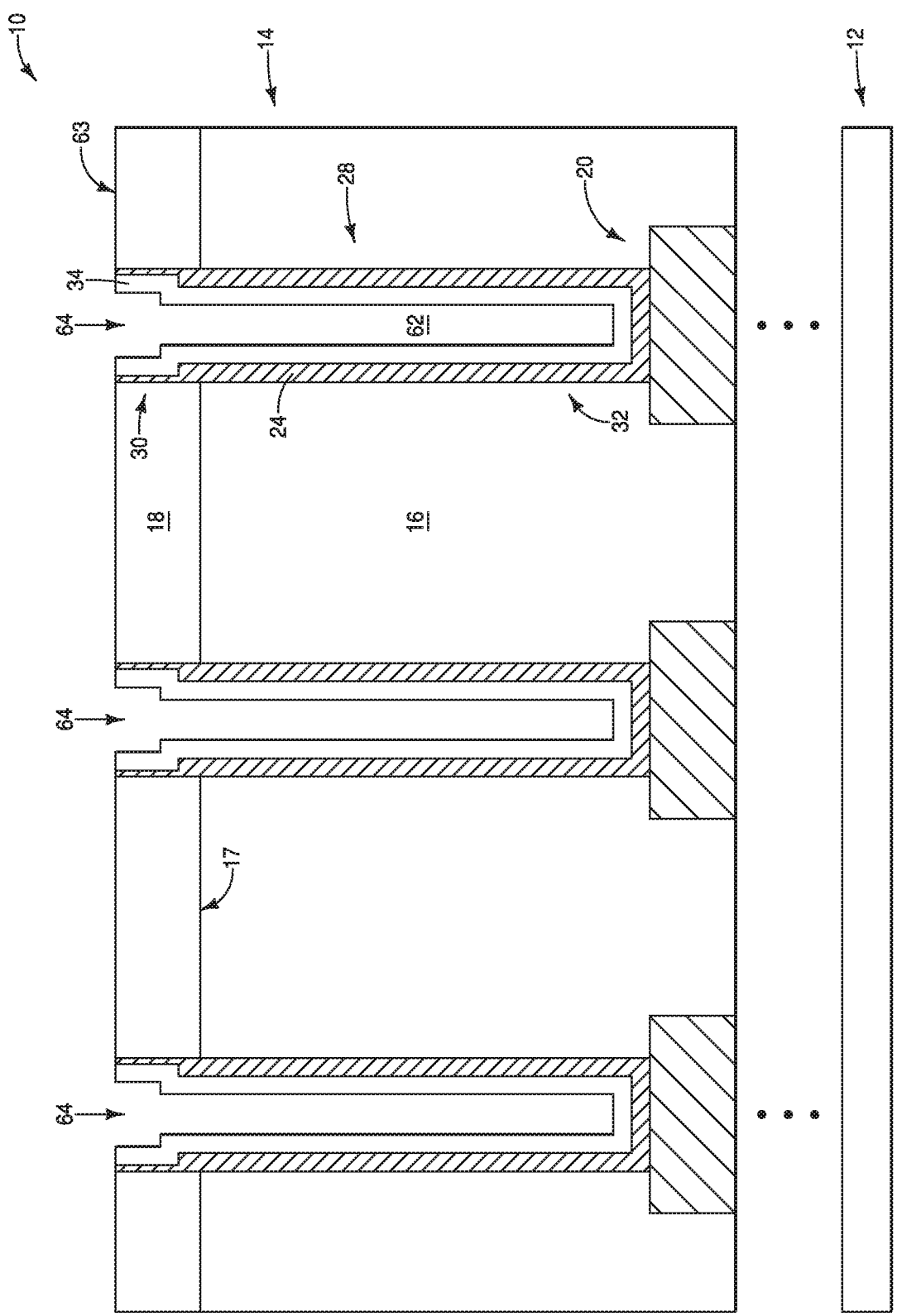

Referring to FIG. 13, the sacrificial material 62 (FIG. 12) is removed to leave openings 64 extending into the interior regions of the container-shaped structures 28.

Figure 14:
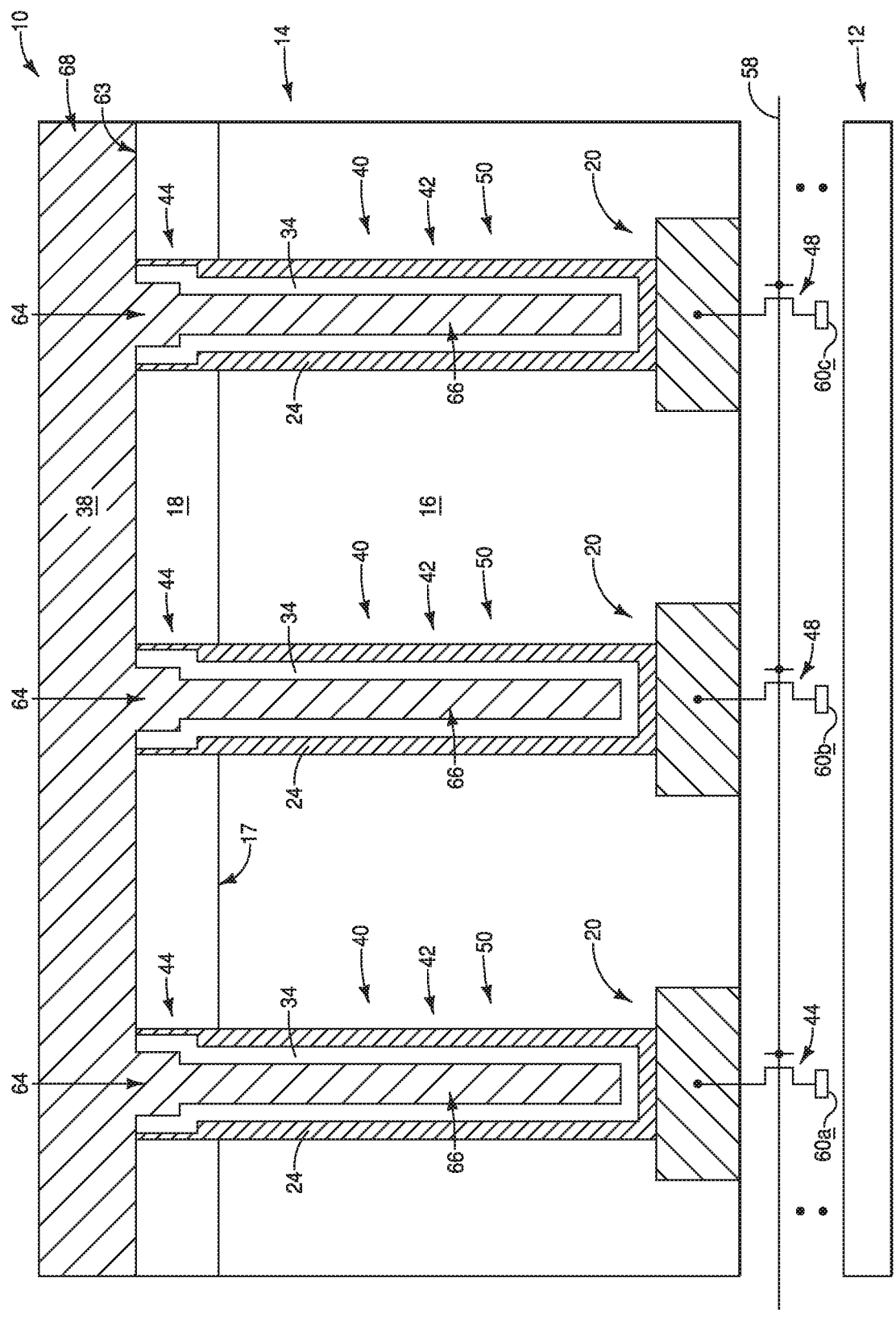

Referring to FIG. 14, the conductive-plate-material 38 is formed on the planarized surface 63 and within the openings 64. Portions of the material 38 within the opening 64 correspond to the top electrodes 66 of the capacitors 40, while the portion of the material 38 over the capacitors 40 and the surface 63 corresponds to the conductive plate 68.

The configuration of FIG. 14 comprises memory cells 50 analogous to those described above with reference to FIG. 10. Such memory cells are coupled to digit lines 60a-c through the transistors 48. The wordline 58 extends along the gates of such transistors.

Figure 15:
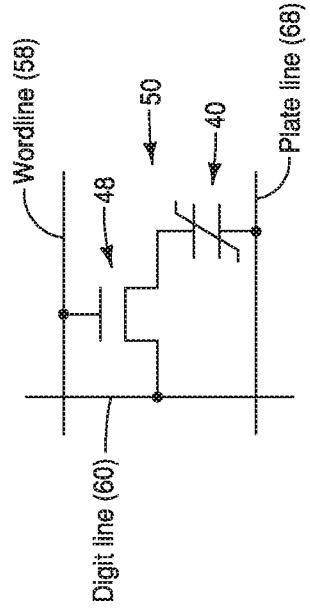
FIG. 15 is a diagrammatic schematic view of an example memory cell.
Figure 16:
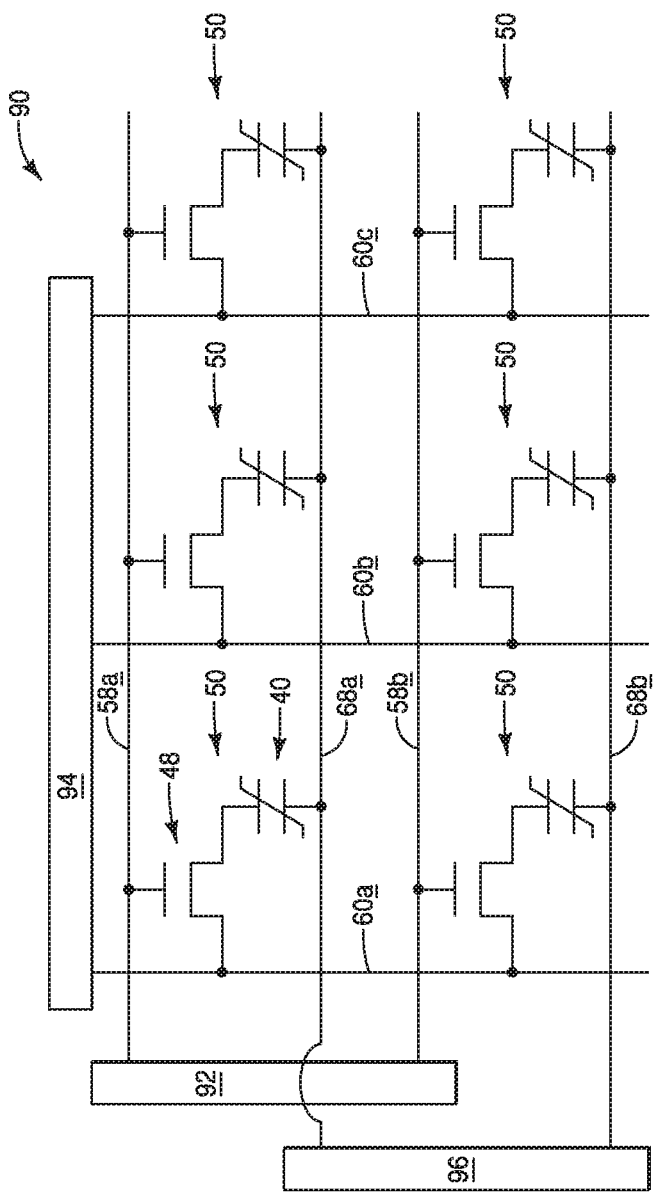
FIG. 16 is a diagrammatic schematic view of a region of an example memory array.

The memory cells 50 of FIGS. 10 and 14 include transistors 48 in combination with the capacitors 40 (which may be ferroelectric capacitors). An example memory cell 50 is schematically illustrated in FIG. 15. The memory cell 50 is shown coupled with a wordline 58 and a digit line 60. Also, one of the electrodes of the ferroelectric capacitor 40 is shown coupled with a plate line 68. The plate line may be utilized in combination with the wordline 58 for controlling an operational state of the ferroelectric capacitor 40.

The memory arrays described above may be ferroelectric memory arrays, and may have any suitable configuration. An example ferroelectric memory array (FeRAM array) 90 is described with reference to FIG. 16. The memory array includes a plurality of substantially identical ferroelectric capacitors 40 (with the term "substantially identical" meaning identical to within reasonable tolerances of fabrication and measurement). Wordlines (first linear structures) 58a and 58b extend along rows of the memory array, and digit lines (second linear structures) 60a-c extend along columns of the memory array. Each of the capacitors 40 is within a memory cell 50 which is uniquely addressed utilizing a combination of a wordline and a digit line. The wordlines 58 extend to driver circuitry (wordline-driver-circuitry) 92, and the digit lines 60 extend to detecting circuitry (sense-amplifier-circuitry) 94. The plate lines 68 (shown as plate lines 68a and 68b) extend to a suitable reference source 96 or driver (in some applications, the plate "lines" may actually be a large expanse of conductive material extending across all of the capacitors rather than being individual lines).

The embodiments described herein may advantageously form leaker devices (44) and bottom electrodes (42) from a single material (24) deposited in a single step, rather than forming the leaker devices from different materials than those of the bottom electrodes. Accordingly, embodiments described herein may reduce deposition steps as compared to conventional processes that form leaker devices from different materials than those utilized in bottom electrodes.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include a capacitor having a container-shaped bottom portion. The bottom portion has a thin region over a thick region. The thin region is a leaker region and the thick region is a bottom electrode region. The bottom portion has an interior surface that extends along the thin and thick regions. An insulative material extends into the container shape of the bottom portion. The insulative material lines the interior surface of the container shape of the bottom portion. A conductive plug extends into the container shape of the bottom portion and is adjacent the insulative material. A conductive structure extends across the conductive plug, the insulative material and the thin region of the bottom portion. The conductive structure directly contacts the insulative material and the thin region of the bottom portion, and is electrically coupled with the conductive plug.

Some embodiments include a memory array comprising memory cells. Each of the memory cells includes a conductive bottom portion having a thin leaker-device region over a thick electrode region, a ferroelectric insulative material extending along the thin leaker-device region and the thick electrode region of the conductive bottom portion, and a conductive second electrode region spaced from the conductive bottom portion by the ferroelectric insulative material. One or more conductive plate structures extend across the conductive second electrodes. The conductive plate structures directly contact the insulative material and the thin leaker-device regions, and are electrically coupled with the conductive second electrode regions. Transistors have first source/drain regions, second source/drain regions, and channel regions between the first and second source/drain regions. The first source/drain regions are electrically coupled with the thick electrode regions. First linear structures are along the channel regions of the transistors. Second linear structures are coupled with the second source/drain regions.

Some embodiments include a method of forming an assembly. Conductive blocks are formed over a base. An insulative mass is formed over the conductive blocks. Openings are formed to extend through the insulative mass to the conductive blocks. The openings are lined with first conductive material. The first conductive material forms upwardly-opening container-shaped structures within the openings. Top regions of the container-shaped structures are narrowed while leaving lower regions of the container-shaped structures thick. The narrowed top regions are leaker regions and the thick lower regions are bottom electrode regions. The container-shaped structures are lined with insulative-capacitor-material. Capacitor-electrode-material is formed within the lined container-shaped structures. The capacitor-electrode-material, insulative-capacitor-material and container-shaped structures together forming a plurality of capacitors. Conductive-plate-material is formed to extend across the capacitor-electrode-material and the leaker regions. The conductive-plate-material is directly against the leaker regions.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A capacitor, comprising:
   a container-shaped bottom portion; the container-shaped bottom portion having a first region over a second region; the second region is a structure of material wherein the first region is a continuous extension of the same structure of material with the first region being thinner than the second region; the first region being a leaker region and the second region being a bottom electrode region; the container-shaped bottom portion having an interior surface that extends along the first and second regions;
   an insulative material extending into the container shape of the bottom portion; the insulative material lining the interior surface of the container-shaped bottom portion;
   a conductive plug extending into the container shape of the bottom portion and being adjacent the insulative material; and
   a conductive structure extending across the conductive plug, the insulative material and the first region of the container-shaped bottom portion; the conductive structure directly contacting the insulative material and the first region of the container-shaped bottom portion, and being electrically coupled with the conductive plug.

2. The capacitor of claim 1 wherein the conductive plug is a same composition as the conductive structure.

3. The capacitor of claim 1 wherein the conductive plug is a different composition relative to the conductive structure.

4. The capacitor of claim 1 wherein the insulative material is ferroelectric insulative material.

5. The capacitor of claim 4 wherein the ferroelectric insulative material includes one or more of zirconium, zirconium oxide, niobium, niobium oxide, hafnium, hafnium oxide, lead zirconium titanate, and barium strontium titanate.

6. The capacitor of claim 5 wherein the ferroelectric insulative material further includes one or more of one or more of silicon, aluminum, lanthanum, yttrium, erbium, calcium, magnesium and strontium.

7. The capacitor of claim 1 wherein the container-shaped bottom portion comprises one or more of Al, Hf, Zr, Ti, Ni and Nb, in combination with one or more of B, Ge, Si, O, N and C.

8. The capacitor of claim 1 wherein the container-shaped bottom portion comprises one or more of Si, Ge, SiN, TiSiN, TiO, TiN, NiO, NiON and TiON; where the chemical formulas indicate primary constituents rather than particular stoichiometries.

9. The capacitor of claim 1 wherein the container-shaped bottom portion comprises TiON, where the chemical formula indicates primary constituents rather than a specific stoichiometry.

10. The capacitor of claim 9 wherein:
the Ti is present to a concentration within a range of from 20 at % to 50 at %;
the O is present to a concentration within a range of from 10 at % to 80 at %; and
the N is present to a concentration within a range of from 10 at % to 80 at %.

11. The capacitor of claim 9 wherein:
the Ti is present to a concentration of 40 at %;
the O is present to a concentration within a range of from 10 at % to 50 at %; and
the N is present to a concentration within a range of from 10 at % to 50 at %.

12. The capacitor of claim 9 wherein the TiON is substantially entirely in an orthorhombic crystalline form.

13. The capacitor of claim 1 wherein:
the second region of the container-shaped bottom portion has a first thickness, with the first thickness being within a range of from 3 nm to 50 nm; and
the first region of the container-shaped bottom portion has a second thickness, with the second thickness being within a range of from 1% of the first thickness to 99% of the first thickness.

14. The capacitor of claim 13 wherein the second thickness is within a range of from 8% of the first thickness to 90% of the first thickness.

15. The capacitor of claim 1 wherein the container-shaped bottom portion has a height within a range of from 100 nm to 500 nm.

16. The capacitor of claim 15 wherein the height is a first height; wherein the first region of the container-shaped bottom portion has a second height; and wherein the second height is within a range of from 1 nm to 95% of the first height.

17. The capacitor of claim 16 wherein the second height is within a range of from 1 nm to 50% of the first height.

18. The capacitor of claim 16 wherein the second height is within a range of from 1 nm to 20% of the first height.

19. The capacitor of claim 16 wherein the second height is within a range of from 1 nm to 10% of the first height.

20. The capacitor of claim 1 comprising no compositional interface between the first and second regions.

21. A memory array, comprising:
memory cells; each of the memory cells including a conductive bottom portion having a thin leaker-device region over, and being thinner than, a thick electrode region, the thin leaker-device region comprises an exterior surface that extends from, and is aligned colinearly with, an exterior surface of the thick electrode region; a ferroelectric insulative material extending along the thin leaker-device region and the thick electrode region of the conductive bottom portion, and a conductive second electrode region spaced from the conductive bottom portion by the ferroelectric insulative material;
one or more conductive plate structures extending across the conductive second electrodes; the conductive plate structures directly contacting the insulative material and the thin leaker-device regions, and being electrically coupled with the conductive second electrode regions;
transistors having first source/drain regions, second source/drain regions, and channel regions between the first and second source/drain regions; the first source/drain regions being electrically coupled with the thick electrode regions;
first linear structures along the channel regions of the transistors; and
second linear structures coupled with the second source/drain regions.

22. The memory array of claim 21 wherein the first linear structures are coupled with driver circuitry, and wherein the second linear structures are coupled with sense-amplifier-circuitry.

23. The memory array of claim 21 wherein said one or more conductive plate structures comprise a same composition as said second electrode regions.

24. The memory array of claim 21 wherein said one or more conductive plate structures comprise a different composition than said second electrode regions.

25. The memory array of claim 21 wherein the conductive bottom portions comprise one or more of Si, Ge, SiN, TiSiN, TiO, TiN, NiO, NiON and TiON; where the chemical formulas indicate primary constituents rather than particular stoichiometries.

26. The memory array of claim 21 wherein the conductive bottom portions comprise TiON, where the chemical formula indicates primary constituents rather than a specific stoichiometry.

27. The memory array of claim 26 wherein:
the Ti is present to a concentration of about 40 at %;
the O is present to a concentration within a range of from about 10 at % to about 50 at %; and
the N is present to a concentration within a range of from about 10 at % to about 50 at %.

28. The memory array of claim 26 wherein the TiON is substantially entirely in an orthorhombic crystalline form.

29. The memory array of claim 21 wherein:
the thick electrode regions of the conductive bottom portions have a first thickness, with the first thickness being within a range of from about 3 nm to about 50 nm; and
the leaker-device regions of the conductive bottom portions have a second thickness, with the second thickness being within a range of from about 1% of the first thickness to about 99% of the first thickness.

30. The memory array of claim 29 wherein the second thickness is within a range of from about 8% of the first thickness to about 90% of the first thickness.

31. The capacitor of claim 1 wherein the conductive structure and the conductive plug comprise a single physical structure of material.

32. The capacitor of claim 1 wherein, in a vertical cross section, the container-shaped bottom portion has a same horizontal dimension at the leaker region as at the bottom electrode region.

33. The memory array of claim 21 wherein, in a vertical cross section, the conductive bottom portion has a same horizontal dimension at the leaker-device region as at the electrode region.

34. The memory array of claim 21 wherein the conductive second electrode and at least one of the one or more conductive plate structures comprise a single physical structure of material.

35. A capacitor, comprising:
first electrode material having a container shape comprising a leaker region over a bottom electrode region, the bottom electrode region comprising an uppermost surface and the leaker region extending directly from a portion of the uppermost surface;
an insulative material extending into the container shape and lining an interior periphery of the container shape, the insulative material contacting another portion of the uppermost surface of the bottom electrode;
second electrode material extending into the container shape adjacent the insulative material; and
a conductive structure extending across the second electrode material, the insulative material and the leaker region, the conductive structure electrically coupled with the second electrode material.

36. The capacitor of claim 35 wherein the conductive structure and the second electrode material comprise a single physical structure of material.

37. The capacitor of claim 35 wherein, in a vertical cross section, the leaker region has a horizontal dimension equal to a horizontal dimension of the bottom electrode region.

38. The capacitor of claim 1 wherein an entirety of the structure of the leaker region comprises an exterior surface that extends from, and is aligned colinearly with, an exterior surface of the bottom electrode region.

39. The capacitor of claim 1 wherein an entirety of the structure of the leaker region is elevationally above an entirety of the bottom electrode region.

40. The capacitor of claim 1 wherein an entirety of the structure of the leaker region extends between the bottom electrode region and the conductive structure.

41. The memory array of claim 21 wherein the thick electrode region comprises an uppermost surface and wherein the thin leaker-device region contacts the thick electrode region at only the uppermost surface.

42. The memory array of claim 21 wherein the thick electrode region comprises an uppermost surface and wherein the thin leaker-device region extends from only a portion of the uppermost surface of the thick electrode region.

43. The memory array of claim 21 wherein an entirety of the structure of the thin leaker-device region is elevationally above an entirety of the structure of the thick electrode region.

44. The capacitor of claim 35 wherein the leaker region comprises an exterior surface that extends from, and is aligned colinearly with, an exterior surface of the bottom electrode region.

45. The capacitor of claim 35 wherein the leaker region contacts the bottom electrode region at only the uppermost surface.

46. The capacitor of claim 35 wherein the leaker region extends from only a portion of the uppermost surface of the bottom electrode region.

47. The capacitor of claim 35 wherein an entirety of the structure of the leaker region is elevationally above the bottom electrode region.

48. The capacitor of claim 35 wherein an entirety of the structure of the leaker region extends between the bottom electrode region and the conductive structure.

49. A capacitor, comprising:
a single and continuous structure of a first conductive material comprising a container shape, a lower section of the container shape comprising a bottom electrode and an upper section continuous from the lower section, the lower section comprising a leaker device;
an insulative material lining an interior surface of the container shape of the conductive material and leaving a central opening; and
a second conductive material filling the central opening.

50. The capacitor of claim 49 wherein the lower section of the conductive material comprises a first thickness and the upper section comprises a second thickness smaller than the first thickness.

51. The capacitor of claim 49 further comprising:
a first insulative mass;
a second insulative mass over the first insulative mass and forming an interface between the two insulative masses; and
wherein the capacitor extends through the first and second insulative masses and wherein an entirety of the structure of the leaker device is above the interface between the two insulative masses.

52. The capacitor of claim 49 further comprising:
a conductive plate over the capacitor wherein the leaker device only extends between the bottom electrode and the conductive plate.

53. The capacitor of claim 35 further comprising:
a first insulative mass;
a second insulative mass over the first insulative mass and forming an interface between the two insulative masses; and
wherein the capacitor extends through the first and second insulative masses and wherein an entirety of the structure of the leaker region is above the interface between the two insulative masses.

* * * * *